United States Patent
Rehman

(10) Patent No.: US 8,618,891 B2
(45) Date of Patent: Dec. 31, 2013

(54) METHOD AND APPARATUS OF A RESONANT OSCILLATOR SEPARATELY DRIVING TWO INDEPENDENT FUNCTIONS

(75) Inventor: Syed Enam Rehman, Mission Viejo, CA (US)

(73) Assignee: Tensorcom, Inc., Carlsbad, CA (US)

( * ) Notice: Subject to any disclaimer, the term of this patent is extended or adjusted under 35 U.S.C. 154(b) by 0 days.

(21) Appl. No.: 13/340,790

(22) Filed: Dec. 30, 2011

(65) Prior Publication Data

US 2013/0169368 A1    Jul. 4, 2013

(51) Int. Cl.
*H03B 1/00*    (2006.01)

(52) U.S. Cl.
USPC ............ 331/167; 331/177 V; 331/74; 331/34; 331/1 A

(58) Field of Classification Search
USPC ............... 331/57, 34, 1 A, 177 V, 167, 74
See application file for complete search history.

(56) References Cited

U.S. PATENT DOCUMENTS

| | | | |
|---|---|---|---|
| 5,396,195 A | 3/1995 | Gabara | |
| 6,737,927 B2 * | 5/2004 | Hsieh | 331/74 |
| 7,274,264 B2 | 9/2007 | Gabara | |
| 7,362,187 B1 * | 4/2008 | Lai et al. | 331/45 |

* cited by examiner

*Primary Examiner* — Arnold Kinkead
(74) *Attorney, Agent, or Firm* — Thaddeus Gabara; Tyrean Patent Prosecution Law Firm

(57) ABSTRACT

Capacitive adjustment in an RCL resonant circuit is typically performed by adjusting a DC voltage being applied to one side of the capacitor. One side of the capacitor is usually connected to either the output node or the gate of a regenerative circuit in an RCL resonant circuit. The capacitance loading the resonant circuit becomes a function of the DC voltage and the AC sinusoidal signal generated by the resonant circuit. By capacitively coupling both nodes of the capacitor, a DC voltage can control the value of the capacitor over the full swing of the output waveform. In addition, instead of the RCL resonant circuit driving a single differential function loading the outputs, each output drives an independent single ended function; thereby providing two simultaneous operations being determined in place of the one differential function.

11 Claims, 5 Drawing Sheets

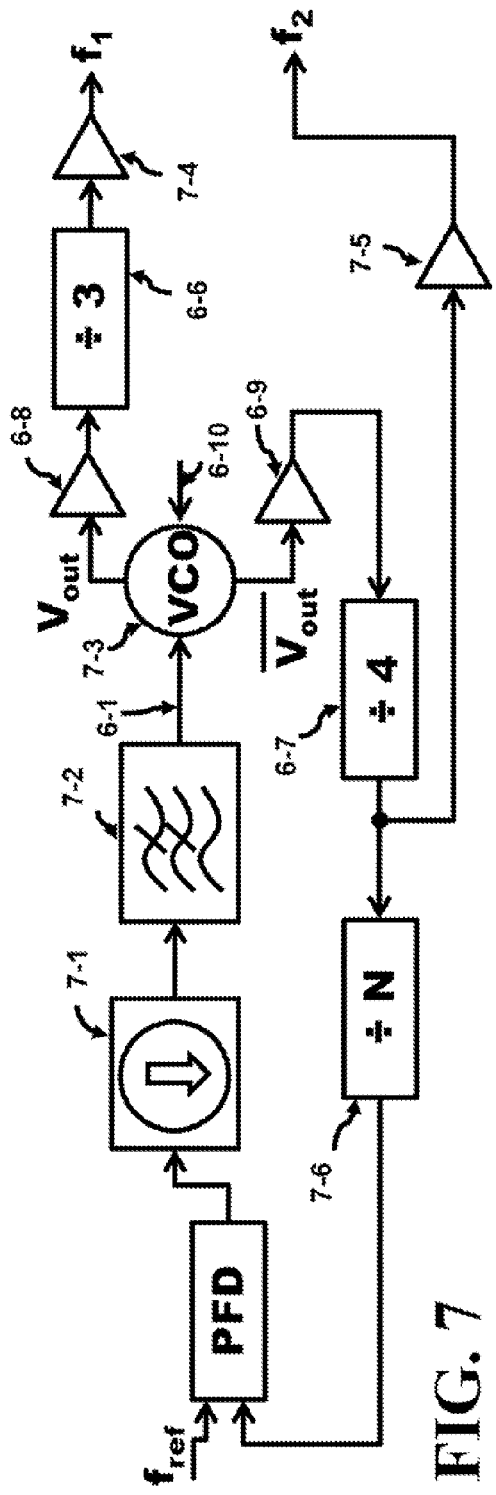
FIG. 7
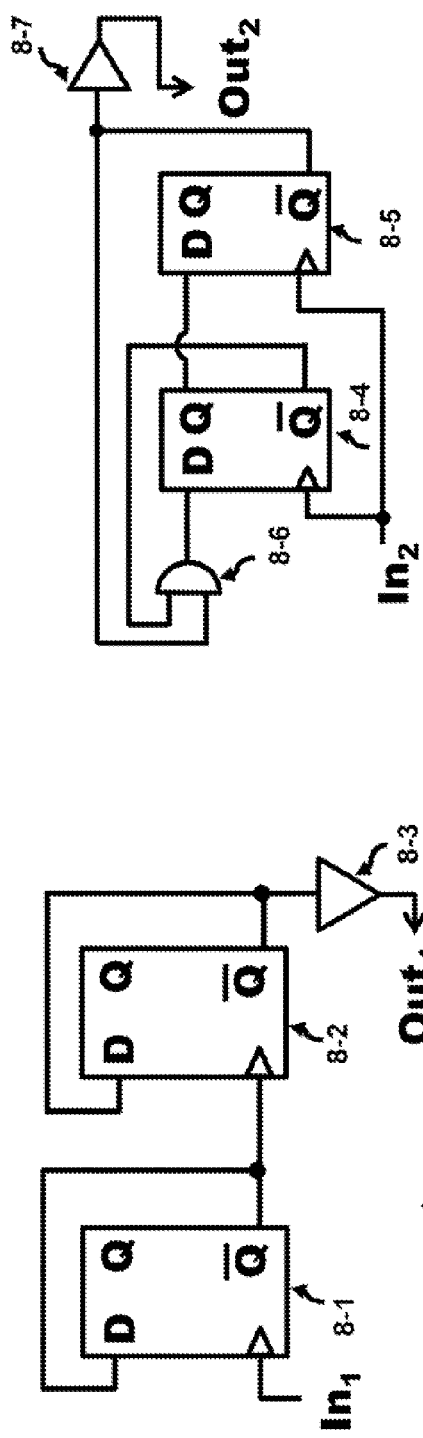
FIG. 8a
FIG. 8b

METHOD AND APPARATUS OF A RESONANT OSCILLATOR SEPARATELY DRIVING TWO INDEPENDENT FUNCTIONS

CROSS REFERENCE TO RELATED APPLICATIONS

The present application is related to the co-filed U.S. application Ser. No. 13/340,813, entitled "Method and Apparatus of Capacitively Coupling an Adjustable Capacitive Circuit in a VCO" filed on Dec. 30, 2011, which are invented by the same inventor as the present application and incorporated herein by reference in their entireties.

BACKGROUND OF THE INVENTION

CMOS (Complementary Metal Oxide Semiconductor) is the primary technology used to construct integrated circuits. N-channel devices and P-channel devices (MOS device) are used in this technology which uses fine line technology to consistently reduce the channel length of the MOS devices. Current channel lengths are 40 nm, the power supply of VDD equals 1.2V and the number of layers of metal levels can be 8 or more.

Oscillators and frequency adjust of the oscillators are fundamental components in electronic systems such as communication systems. Typically, the highest performance circuits in a given technology are usually measured in some form of an on-chip free running oscillator, such as; a ring oscillator using transistors or a resonant oscillator that uses transistors and reactive components in a regenerative connection. The oscillators are powered by a first plurality of DC voltages to generate clock signals that adjust and synchronize the operation of the die or integrated circuit chip. The oscillators typically include a frequency adjust circuit to adjust the frequency of the oscillator. Once these clock signals are generated in the die, a Phase Lock Loop (PLL) can be used to compare a reference clock with the generated clock signal to maintain the frequency of operation of the oscillator at a stable value as is well known in the art.

The resonant circuit can be a differential resonant circuit that generates a clock signal and an inverse (180° phase difference) clock signal, simultaneously, on its two output nodes. These two outputs are applied to a first differential function which can perform a first plurality of related computations where the first differential function can be a differential amplifier, a mixer, a filter, a counter, a divider, etc. If a second differential function is desired, a second differential function is coupled to the differential output nodes and loads the resonant circuit thereby decreasing the operating frequency. An increase in power dissipation may be required to compensate for the frequency reduction.

Varactors, also known as a variable capacitance diode, can be operated in the reversed biased state to provide a capacitance for the resonant oscillator. The reverse bias is provided by biasing the nodes of the varactor with a second plurality of DC bias voltages. These DC bias voltages bias the MOS device to create a variable capacitance. DC paths between the first plurality of DC voltages and second plurality of DC adjust voltages can exist which can cause the resonant oscillator to behave more non-linearly due to the varactor or MOS device being DC coupled or partially DC coupled to the resonant oscillator.

BRIEF SUMMARY OF THE INVENTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

One of the embodiments of the disclosure introduces a DC adjustable capacitance into a resonant circuit by using a differential AC coupling technique. The resonant circuit is a differential resonant circuit that generates a clock signal and the clock signal's inverse, simultaneously, on one of the two output nodes, respectively. A DC adjustable capacitance is formed from an MOS device by applying a first DC bias voltage to the source and drain nodes and a second DC bias voltage to the gate of the MOS device. Two MOS devices are connected back to back where the source and drain nodes of one MOS device is connected to the source and drain nodes of the second device. These two MOS devices are coupled to the output nodes of the resonant circuit using a first and a second outer capacitor. The inventive technique uses the first and the second outer capacitor coupled in series with the capacitance of the two back to back MOS devices to place effectively four series capacitors between the two output nodes of the differential resonant circuit. The first and second DC bias voltages can continuously adjust the capacitance value of the two DC adjustable capacitances and provides a fine frequency adjust of the resonant circuit by varying the overall capacitance value of the four series capacitors presented to the resonant circuit.

Another embodiment of the disclosure eliminates DC paths between the first plurality of DC voltages and second plurality of DC bias voltages by isolating these paths using a coupling capacitor. This DC isolation insures that the varactor or MOS device presents a substantially constant capacitance to the resonant oscillator for the full duration of an oscillation cycle when the DC bias voltages are set to a given value. The non-linear capacitive behavior of the varactor or MOS device is varied when these DC bias voltages are altered to a second given value. Once again the varactor or MOS device presents a substantially constant capacitance to the resonant oscillator for the full duration of a longer/shorter oscillation cycle when the DC bias voltages are set to this second given value. Thus, the non-linear behavior of the DC adjustable capacitance of the MOS device is shielded from the normal operation of the resonant oscillator.

Another embodiment of the disclosure is that the two outer capacitors coupled in series present an upper maximum capacitance to the differential resonant circuit and can be used to isolate or restrict large parasitic capacitances formed by the MOS devices. The two series capacitors couples in a third and a fourth adjustable series capacitance of the fine adjust circuit to the nodes of the resonant circuit. Two MOS devices are coupled back to back to form the third and the fourth adjustable series capacitance. The capacitance of the two MOS back to back devices is varied electronically using a first DC voltage applied to the source and drain nodes and a second DC voltage applied to the gate of the MOS devices. The third and fourth adjustable capacitors can be varied causing the load on the resonant circuit to vary.

The coarse adjust capacitance circuit uses two additional outer capacitors and a switch. The outer capacitors are coupled in series with the switch to the resonant circuit. Each switch (MOS device) can have a large gate width to decrease their resistance. The low impedance of the MOS device couples the two outer capacitors into the resonant circuit.

Each node of the resonant circuit would be presented with a capacitive load comprised of the parallel combination of these two additional outer capacitors. This capacitive load that can be added to the resonant circuit is enabled by the switch and is used to coarsely adjust the capacitance loading the outputs of the resonant circuit.

Another embodiment of the disclosure presents how a second function can be coupled to the output node of a resonant circuit without necessarily decreasing the operating frequency. This is achieved by independently loading the first output node of the differential resonant circuit or differential VCO with a first function (that can perform computations) and has a single input while the second output node is loaded with a second function (that can perform different computations). The first or second functions are single-ended functions and can include computations such as a single input amplifier, a mixer, a filter, a counter, a divider, etc. The capacitive load that the first function and second function present to the output nodes of the differential resonant circuit is equivalent to the capacitive load that the first differential function presented to the first and second output nodes. The first and second functions perform different computations yet load the differential resonant circuit with an equivalent load similar to the first differential function mentioned earlier. This is to insure that the load on the differential resonant circuit remains identical and balanced.

Each output node of the resonant circuit can be loaded by additional computational blocks, as long as the summations of the total capacitive load of all computational blocks coupled to each output node match each another. However, due to the larger capacitive load, the power dissipation may increase as the number of total single-ended computational blocks increases to three or more. The balanced load insures that the resonant circuit generates a first waveform and a second waveform that is substantially 180° out of phase with the first waveform.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 1b shows a block diagram of the circuit in FIG. 1a.

FIG. 7 shows a phase lock loop (PLL) with the differential oscillator driving two different functions in accordance with the present invention.

FIG. 8a presents a divide by 4 schematic in accordance with the present invention.

FIG. 8b depicts a divide by 3 schematic in accordance with the present invention.

DETAILED DESCRIPTION OF THE INVENTION

Figure 1B:
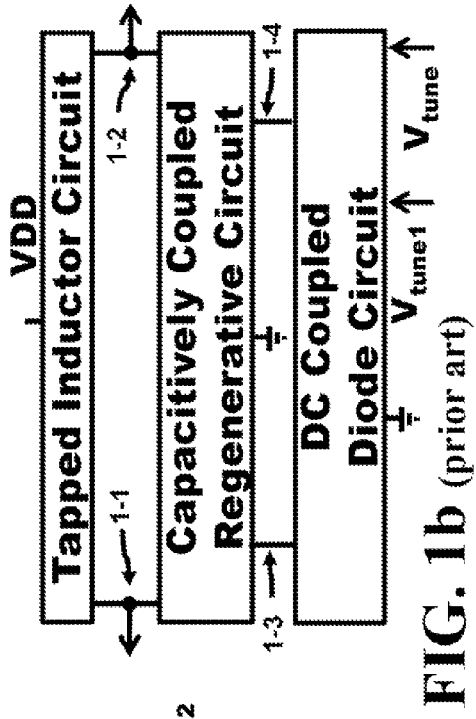
Figure 1A:
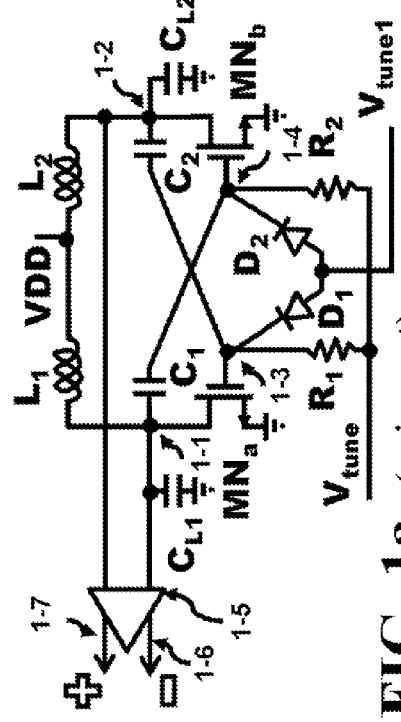
FIG. 1a depicts a circuit diagram of a conventional capacitive coupled oscillator.

FIG. 1a illustrates a differential oscillator that generates an output and inverse output and uses a diode adjust to adjust the frequency. The circuit contains a bi-symmetry of components: $L_1$ and $L_2$, $C_1$ and $C_2$, $MN_a$ and $MN_b$, etc. where each of the matched pairs are substantially equal to one another. The circuit connects an inductor $L_2$ to device $MN_b$ with the gate of the device capacitively coupled to the inverse output node. Similarly, a second inductor $L_1$ connected to device $MN_a$ with the gate of the device capacitively coupled to the output node. The two devices $MN_a$ and $MN_b$ are cross coupled through coupling capacitors $C_1$ and $C_2$.

The gate of both devices $MN_a$ and $MN_b$ in FIG. 1a are set to a voltage $V_{tune}$ using a frequency adjust circuit. The frequency adjust circuit includes the high impedance resisters $R_1$ and $R_2$, the diodes $D_1$ and $D_2$, and the two DC adjust voltages $V_{tune}$ and $V_{tune1}$. The cathode of varactor $D_1$ is coupled to the gate 1-3 of $MN_a$ and the cathode of varactor $D_2$ is coupled to the gate 1-4 of $MN_b$. Their anodes are tied together coupled to and adjusted by a second DC supply $V_{tune1}$. The capacitive load on inverse output 1-1 is $C_{L1}$ while the capacitive load on the output 1-2 is $C_{L2}$. The two outputs are presented to a differential amplifier 1-5 that generates a positive 1-7 and a negative output 1-6. By setting the DC adjust voltage $V_{tune}$ to a voltage greater than the threshold voltage of the n-channel devices enables the n-channel devices. Then, the DC adjust voltage $V_{tune1}$ can be adjusted to vary the voltage across the diode thereby adjusting the capacitive load applied to the gates of $MN_a$ and $MN_b$. As the DC adjust voltage $V_{tune1}$ is varied, the frequency of oscillation of this differential oscillator varies as well.

In FIG. 1b provides a block diagram of FIG. 1a. VDD is coupled to the tapped inductor circuit, the far end of the tapped inductor circuit is coupled to the outputs 1-1 and 1-2. These two output nodes are coupled in turn to the capacitively coupled regenerative circuit which includes and $MN_a$, $MN_b$, $C_1$ and $C_2$. The gates 1-3 and 1-4 of devices $MN_a$ and $MN_b$ are driven through a high impedance network by a DC voltage $V_{tune}$ to set the bias point. The DC coupled diode circuit is adjusted by the two DC adjust voltages $V_{tune}$ and $V_{tune1}$.

Note in FIG. 1a that the frequency adjust circuitry is directly coupled to the gates of $MN_a$ and $MN_b$. Thus, the gates of $MN_a$ and $MN_b$ receive both a DC adjust voltage component from the frequency adjust circuit and an AC component from the opposing output through the capacitors $C_1$ and $C_2$. Thus, these gates will be adjusted by this DC adjust voltage with a superimposed waveform capacitively coupled through $C_1$ and $C_2$ from the outputs.

An exemplary circuit is described which prevents any gate in the oscillator from receiving any DC adjust voltage component from the frequency adjust circuit as discussed previously. This is achieved by isolating all DC adjust voltages generated by the frequency adjust circuitry by using a capacitive coupling inventive technique. FIG. 2a illustrates such an exemplary circuit where the frequency adjust circuitry which contains the adjustable capacitance is capacitively coupled to the outputs preventing any DC adjust voltage from connecting to the oscillator. FIG. 2a illustrates a circuit that capacitively couples the adjustable capacitors of a frequency adjust circuit to a RLC resonant circuit (oscillator). The RLC resonant circuit contains at least one course adjust capacitance and a fine adjust capacitance. The course capacitive adjustment introduces lumped capacitance in steps. The fine adjust capacitance adjustment uses DC adjusts to continuously vary the capacitance between the coarse steps.

FIG. 2a uses two regenerative cross coupled MOS devices. The outputs of the circuit are at nodes 2-1 and 2-2 and each output node has a lump capacitance of $C_{L3}$ and $C_{L4}$ for, respectively. The first regenerative circuit consists of two N-channel devices $M_1$ and $M_2$ cross coupled between the outputs 2-1 and 2-2. The second regenerative circuit is located at the top and consists of the two P-channel devices $M_5$ and $M_6$ that are cross coupled between the outputs 2-1 and 2-2. An inductor circuit formed from a single inductor $L_3$ connects output 2-1 to 2-2. This inductor circuit can be a combination of inductors in series or in parallel; however, the present invention shows a single inductor. The coarse capacitances are located within block 2-6 and it is introduced into this differential circuit by the series combination of capacitors $C_{5a-c}$ and $C_{6a-c}$. The connection is complete when switch $S_{1a-c}$ is digitally enabled. The block 2-6 contains three-coarse adjusts: the a version, the b version, and the c version for the coarse capacitors and switches. Although, any number of coarse steps can be included. The total coarse capacitance, for this case, would be $\frac{1}{2}(C_{5a}+C_{5b}+C_{5c})$ assuming $C_{5a}=C_{6a}$, $C_{5b}=C_{6b}$ and $C_{5c}=C_{6c}$.

FIG. 2a provides a fine adjust that is located within block 2-5 and uses a string of four series capacitors; $C_3$, capacitance of MOS device $M_3$, capacitance of MOS device $M_4$ and capacitance $C_4$. Assume that $C_3$ is substantially equal to $C_4$ and that the two devices $M_3$ and $M_4$ are substantially equal. The center point of the string is where a DC voltage $V_{cnt}$ is applied to the source and drain nodes of devices $M_3$ and $M_4$. To enable setting the gate voltages of $M_3$ and $M_4$, a high impedance resistor string is formed between nodes 2-3 and 2-4 by resisters $R_3$ and $R_4$. The center point of these two resisters is applied to a DC adjust voltage called $V_{bias}$. In this circuit block 2-5, the two DC adjust voltages $V_{bias}$ and the $V_{cnt}$ can be adjusted independently of each other. Furthermore, these two DC adjust voltages are independent of the sinusoidal voltages being formed at the output nodes of 2-1 and 2-2 due to the presence of the coupling capacitors $C_3$ and $C_4$. In addition, these two coupling capacitors $C_3$ and $C_4$ block any low frequency noise introduced by the two DC adjust voltages $V_{bias}$ and the $V_{cnt}$. Thus, this innovative circuit can introduce capacitance into the RLC resonant circuit in coarse steps and/or can be varied continuously within a step independent of the AC operation occurring at the output nodes of this RLC resonant circuit or oscillator.

Figure 2B:
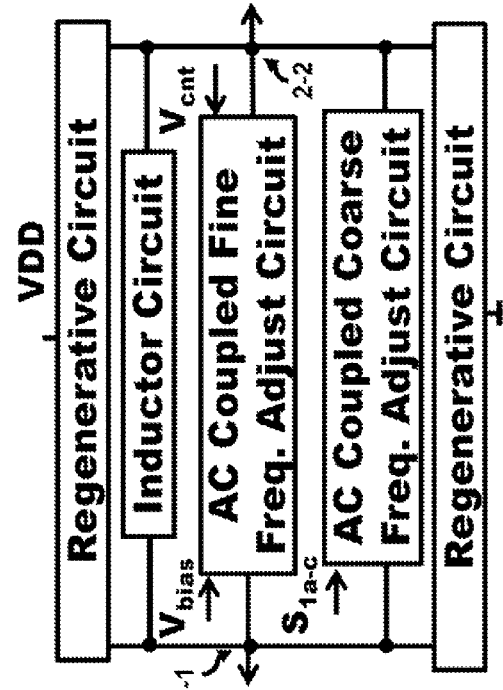
FIG. 2b shows a block diagram of the circuit in FIG. 2a in accordance with the present invention.
Figure 2A:
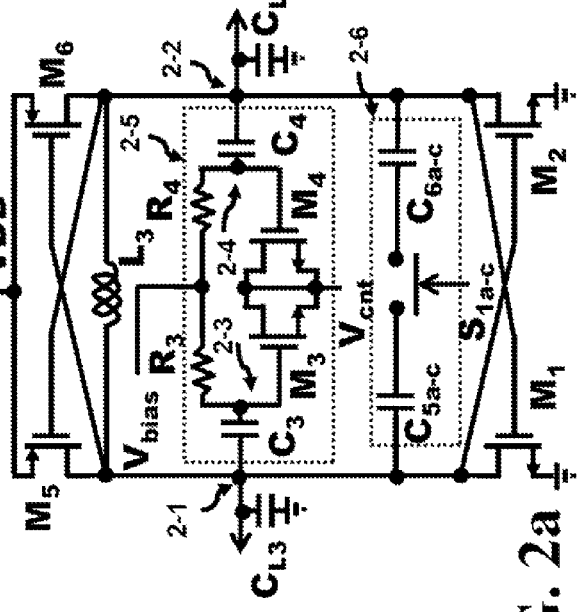
FIG. 2a illustrates a circuit diagram of a capacitive coupled oscillator in accordance with the present invention.

A block diagram of FIG. 1b is provided in FIG. 2b. Starting from the top, VDD is connected to the regenerative circuit. The two lower outputs of the regenerative circuit are connected to the output nodes 2-1 and 2-2. All remaining blocks connect to these two nodes. The inductor circuit is shown just below the regenerative circuit connected to the output nodes. The AC coupled fine frequency adjust circuit uses the DC adjusts $V_{bias}$ and $V_{cnt}$ to adjust the bias applied to the two MOS devices $M_3$ and $M_4$ and is connected to the two output nodes. The AC coupled course frequency adjust circuit uses a digital adjust to enable or disable the switches $S_{1A-C}$. Finally a second regenerative circuit is connected to the output nodes 2-1 and 2-2 and connects the RLC resonant circuit to ground.

Figure 3A:
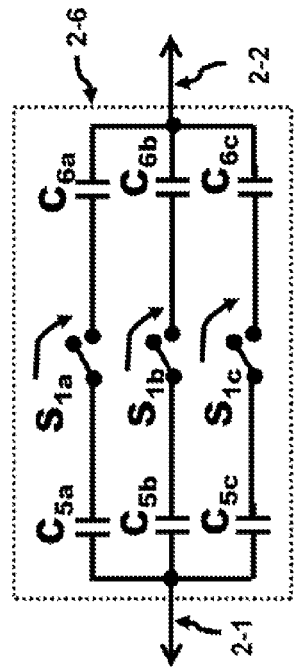
FIG. 3a presents the fine frequency capacitive adjustment circuit in accordance with the present invention.

FIG. 3a presents the AC coupled fine frequency adjust circuit 2-5 that is connected to nodes 2-1 and 2-2. The center point of this symmetric network is $V_{bias}$ between the resisters $R_3$ and $R_4$ and the DC adjust voltage $V_{cnt}$ which couples to the sources and drains of the MOS devices $M_3$ and $M_4$. This differential circuit is capacitively coupled to the RLC resonant differential circuit to present an adjustable capacitance to both output nodes 2-1 and 2-2.

Figure 3B:
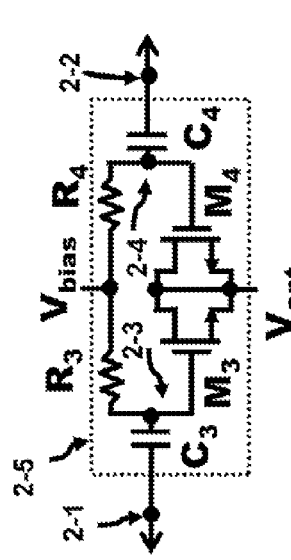
FIG. 3b depicts a simplified diagram of FIG. 3a in accordance with the present invention.
Figure 3C:
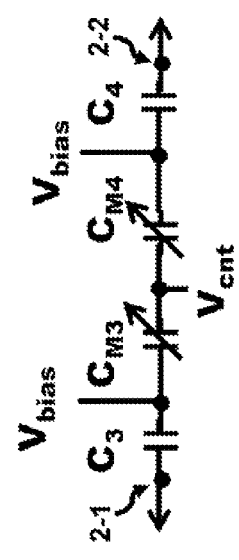
FIG. 3c shows a further simplified diagram of FIG. 3b in accordance with the present invention.

In FIG. 3b, a simplified representation of the MOS devices is illustrated. The MOS devices $M_3$ and $M_4$ have been substituted by adjustable capacitors $C_{M3}$ and $C_{M4}$. The adjustment to these capacitors is through the two DC adjust voltages $V_{bias}$ and $V_{cnt}$, but because of the differential nature of the resonant RLC network, the two DC adjust voltages $V_{bias}$ and $V_{cnt}$ behave as AC grounds. Thus, the output node 2-1 is loaded with the capacitance $C_3$ in series with the parallel combination of $C_{M3}$ and $R_3$. However, $R_3$ is very large in comparison to the AC impedance of $C_{M3}$ and can be disregarded. The fine capacitance equals $CF_{2-1}=(C_3)(C_{M3})/((C_3)+(C_{M3}))$. As $C_{M3}$ is adjusted; the capacitive value on node 2-1 varies accordingly. The resistors have been removed in FIG. 3C further simplify the AC coupled fine frequency adjust circuit. The four capacitors being in series is very evident.

A coarse capacitive adjustment technique using a plurality of digitally adjusted switches coupled to two capacitors in series to enable/disable and connect the two series capacitors to the resonant circuit's output nodes. Each digital increment adjusts the capacitive loading presented to the resonant circuit's output in discrete steps. In between these discrete steps, the fine frequency adjust to the resonant circuit can be used to provide a continuous capacitive load.

Figure 3D:
FIG. 3d illustrates the coarse frequency capacitive adjustment circuit in accordance with the present invention.

FIG. 3d presents the block 2-6 which contains the AC coupled fine frequency adjust circuit between output nodes 2-1 and 2-2. Switches $S_{1a}$, $S_{1b}$ and $S_{1c}$ enable or disable a capacitively coupled path between the two output nodes. On each side of this switch is a capacitance, for example, $C_{5a}$ is to the left of switch $S_{1a}$ and capacitance $C_{6b}$ is to the right of switch $S_{1a}$. This switch $S_{1a}$ is ohmically isolated from each of the two output nodes by a capacitance. The capacitance value of $C_{5a}$ substantially equals to the capacitance value of $C_{6a}$. Once the switch $S_{1A}$ is enabled a virtual ground is established at this point because of the differential nature of the RLC resonant circuit. Each output node sees a coarse capacitance equal to $CC_{2-1}=(C_{5a})(C_{6a})/((C_{5a})+(C_{6a}))$. If $C_{5a}$ substantially equals $C_{6a}$, then the capacitance loading each node is $C_{5a}/2$. The coarse capacitor values can be arranged linearly weighted, digitally weighted, or a combination of the two.

Figure 4A:
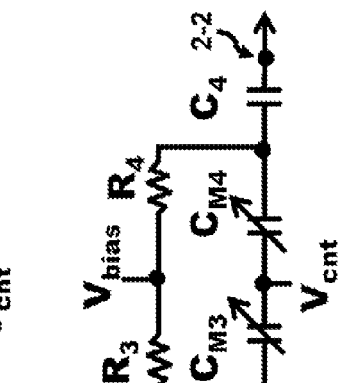
FIG. 4a depicts a cross sectional view if the MOS capacitor in accordance with the present invention.
Figure 4B:
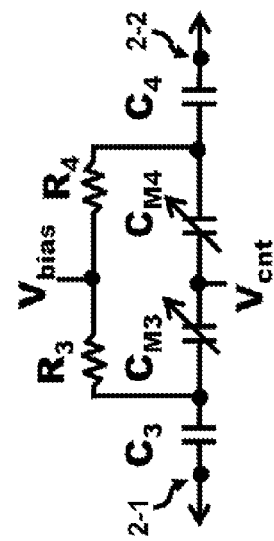
FIG. 4b illustrates the Capacitance vs. Voltage transfer curve of the MOS capacitor in FIG. 4a in accordance with the present invention.

The MOS devices $M_3$ and $M_4$ behaving as adjustable capacitors have a cross-section as illustrated in FIG. 4a. The gate is separated from the Si p-type substrate by an oxide (SiO$_2$). FIG. 4b provides the C-V curve 4-1 for the MOS capacitor. When the potential applied to the gate is more positive than the devices threshold voltage, the device is depleted and will be in a state called inversion. But at high frequencies, the inversion layer is not able to respond so the charge depletion layer needs to make up the difference. As this potential applied to the gate is decreased, the MOS device losses the ability to form an inversion layer and the space-charge region starts to decrease in depth. The series combination of the oxide capacitance and depletion capacitance cause the capacitance to increase. Finally, when the potential to the gate is more negative than the substrate, the interface between the oxide and substrate device goes into the accumulation state by attracting holes at the interface. The capacitance continues to increase until only the capacitance of the oxide is presented to the circuit.

Figure 5A:
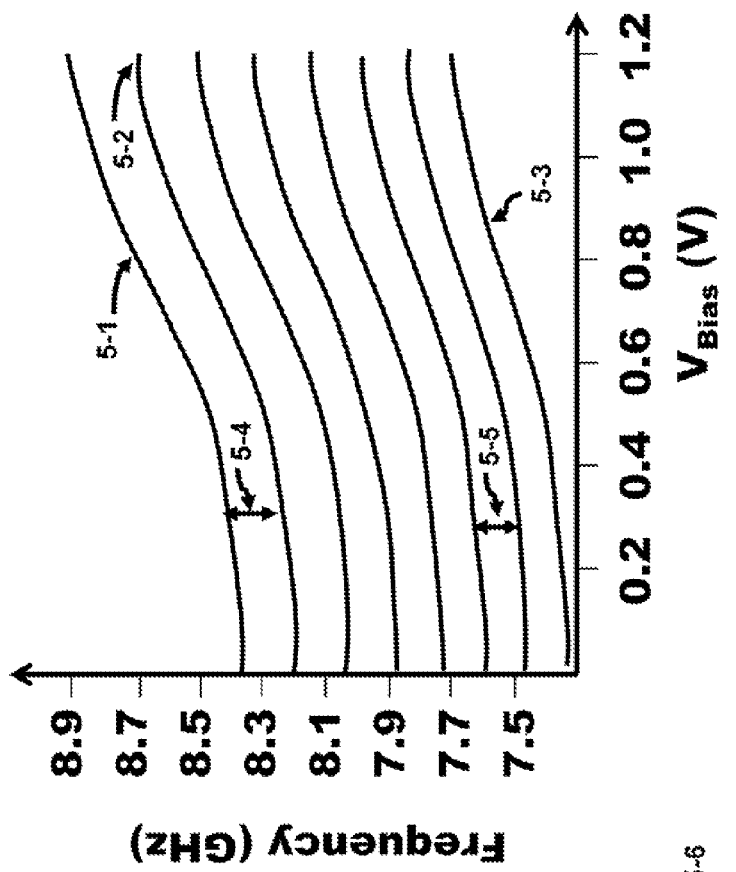
FIG. 5a depicts the simulated Frequency vs. Bias Voltage results of the oscillator of FIG. 2a in accordance with the present invention.

FIG. 5a provides a graph of frequency (GHz) versus the bias voltage applied to the adjustable fine frequency adjust circuit. Superimposed over this graph are the coarse steps of the coarse adjust. The continuous curve is due to the voltage applied at the VCO voltage adjust input (AC coupled fine frequency adjust circuit) by the PLL (Charge pump and loop filter output) to MOS varactor devices. The steps between the continuous curves are coarse steps adjusted by the enablement/disablement of the digital switches. For example waveforms 5-1, 5-2 and 5-3 are individual continuous curves that vary as the bias voltage changes from 0 V to 1.2 V. The waveform 5-1 has a frequency range from about 8.4 GHz to 8.9 GHz. The curve 5-3 starts out at 7.3 GHz and spreads out to 7.6 GHz. Each one of the course adjusts is indicated by the difference between two waveforms at a given bias. For example, displacement 5-4 illustrates a coarse difference between the waveform 5-1 and 5-2 where an additional coarse capacitance has been removed. A second course step is illustrated by 5-5. One can readily see that by using a combination of fine and coarse adjust one can vary the frequency of oscillation of the RLC resonant circuit from 7.4 GHz all the way to 8.9 GHz.

Figure 5B:
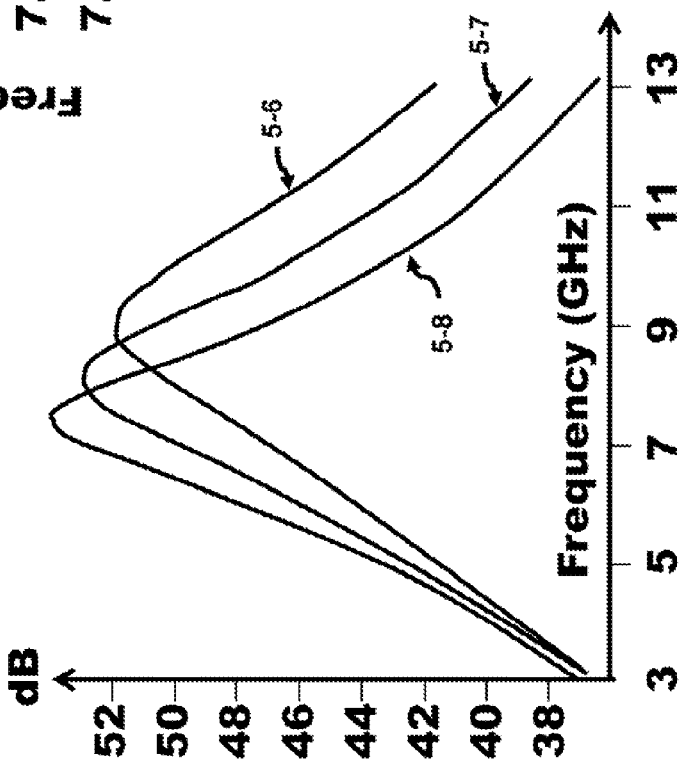
FIG. 5b shows the simulated Gain vs. Frequency results of the oscillator of FIG. 2a in accordance with the present invention.

FIG. 5b illustrates three waveforms 5-6, 5-7 and 5-8 where each curve peaks at a different frequency. The curves are plotted with V$_{cnt}$ (fine adjust) fixed to the middle value of its entire swing (600 mV is mid value between 0V to 1.2V). The curve with lowest frequency 5-8 has all coarse digitally adjusted capacitors switched on. The curve with highest frequency 5-6 has all coarse digitally adjusted capacitors switched off and the curve in the middle 5-7 corresponds to half of the coarse digitally adjusted capacitors enabled by their corresponding switches. This graph shows how the Quality factor degrades or varies across digital tuning range.

Figure 6B:
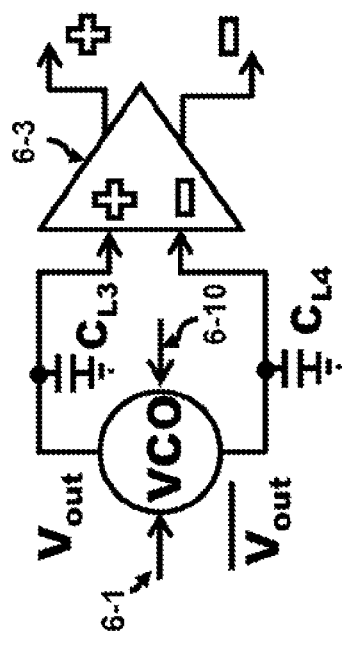
FIG. 6b shows the oscillator providing differential output clocks to differential amplifier.
Figure 6D:
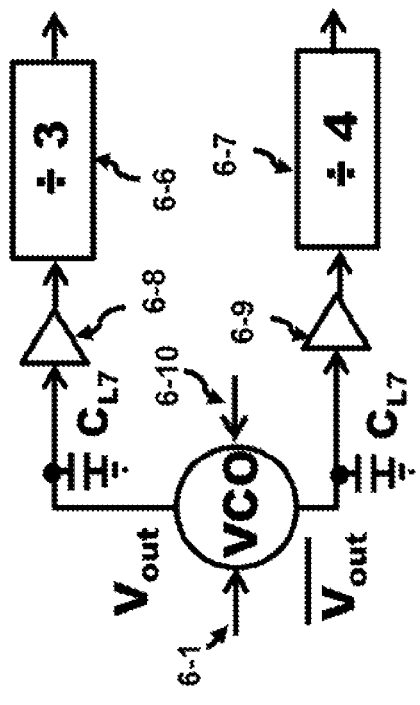
FIG. 6d depicts the oscillator providing each of its differential output clocks to a divide by 3 circuit and a divide by 4 circuit in accordance with the present invention.
Figure 6A:
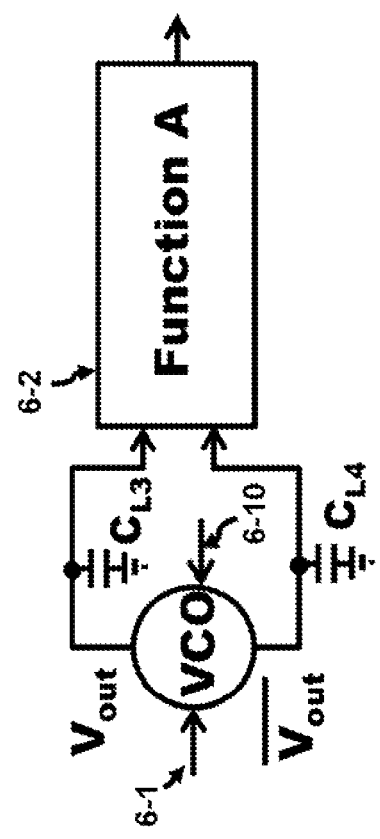
FIG. 6a illustrates the oscillator providing differential output clocks to a conventional single function.

FIG. 6a illustrates a Voltage Controlled Oscillator (VCO) being adjusted by at least one DC adjust voltage input 6-1 for fine capacitance adjustment and at least one digital adjust 6-10 for coarse capacitance adjustment. For example, the circuit described in FIG. 2a can be used to represent the VCO. The VCO is a resonant RLC circuit and generates an oscillatory output and an inverse oscillatory output, in this case V$_{out}$ and $\overline{V}_{out}$. The capacitive load of a first interconnect coupling V$_{out}$ to a first differential input of Function A 6-2 is C$_{L3}$. The capacitive load of a second interconnect coupling $\overline{V}_{out}$ to a second differential input of Function A 6-2 is C$_{L4}$. The input capacitance of each differential input of Function A 6-2 is typically equal. The interconnect is formed by patterned metal layers in a die which has a capacitance based on the geometric structure and position of these metal layers within the structure of the die. When a VCO drives a differential input, the patterned metal layers of the differential interconnects are similar to maintain similar capacitance. Thus, the total capacitive load on each of the output nodes should equal each other. Since the capacitive load on the VCO is equalized, the output and inverse output are 180° apart.

FIG. 6b illustrates the Function A substituted with a differential amplifier 6-3. The input capacitance on the positive and negative input terminals of the differential amplifier is substantially equal. Therefore the interconnect capacitance C$_{L3}$ is made substantially equal to the interconnect C$_{L4}$ in the VCO thereby providing a clock signal to the differential amplifier that is 180° separated in phase.

Figure 6C:
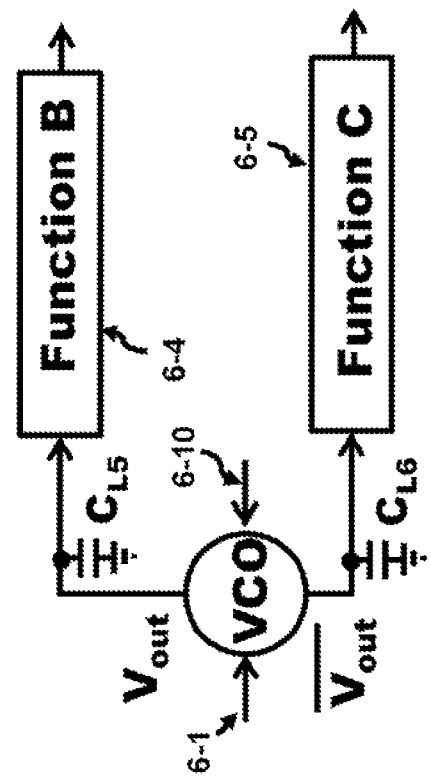
FIG. 6c presents the oscillator providing each of its differential output clocks to one of the two separate functions in accordance with the present invention.

In FIG. 6c, V$_{out}$ couples to the input of the Function B 6-4 by a first interconnect that has a capacitive load of C$_{L5}$. While, $\overline{V}_{out}$ couples to the input of the Function C 6-5 by a second interconnect that has a capacitive load of C$_{L6}$. The Function B 6-4 can be completely different from the Function C 6-5; therefore, the input capacitance of the Function B and Function C generally will be different since these are different blocks. This input capacitance of Function B is called the B function capacitance while the input capacitance of Function C is called the C function capacitance. Any difference between the B function capacitance and C function capacitance needs to be compensated for in either the capacitive load of C$_{L5}$ or C$_{L6}$. The patterned metal layers forming the interconnect can be independently adjusted to ensure that each of the outputs of the VCO has identical capacitive loads, which insures that Function B and Function C are being driven by waveforms 180° apart.

Another aspect of these functions is that each of these functions become single ended. Referring back to FIG. 6b, the two complimentary outputs of the VCO are applied to one function a differential amplifier which requires that the two inputs are driven by a differential signal. However, the functions in FIG. 6c require that each output drives a function that only requires a single input.

In FIG. 6d, the Function B and Function C are substituted by a "divide by 3" 6-6 and "divide by 4" 6-7 functions. In addition, buffers 6-8 and 6-9 are inserted before each function and the outputs of the VCO. These buffers, being identical, equalize the capacitive load presented to the VCO. Thus, the capacitive load C$_{L7}$ at each of the two outputs of the VCO would be equal if the structural layout of the interconnect are equivalent. Thus, each output of the VCO drives a separate independent function where the capacitive load on the two outputs are equalized to insure that the VCO generates two signals 180° out of phase with each other.

An embodiment illustrating this innovative technique is illustrated in FIG. 7. A phase lock loop (PLL) is formed by the PFD (Phase and Frequency Detect) feeding a charge pump 7-1. The output of the charge pump is low-pass filtered 7-2 providing a DC voltage 6-1 that is applied to the VCO 7-3. The output of the VCO is loaded by a buffer 6-8 while the inverse output of the VCO is loaded by a buffer 6-9. Since the two buffers can be sized similarly, the capacitive load at the output of the VCO is equalized. This is a second inventive technique of equalizing and therefore presenting the same capacitive load to the outputs of the VCO. The buffer 6-8 drives the "divide by 3" 6-6 while the second buffer 6-9 drives the "divide by 4" 6-7. The "divide by 4" 6-7 is applied to the "divide by N" 7-6. The second buffer 6-9, the "divide by 4" 6-7 and the "divide by N" 7-6 form the feedback path going back to the PFD from the output of the VCO. The feedback path is compared in the PFD against the input reference frequency f$_{ref}$. Furthermore, the output of the "divide by 4" 6-7 is tapped by the buffer 7-5 to provide a clock signal f$_2$. The output of the "divide by 3" 6-6 is tapped by the buffer 7-4 to generate $f_1$. The two buffers can be adjusted in size to guarantee that the waveforms $f_1$ and $f_2$ maintain a desired phase separation.

FIG. 8a depicts the schematic diagram for the "divide by 4" 6-7 where the input $in_2$ is applied to first FF (flip-flop) 8-1. The output of the first FF is divided by 2 and applied to the second FF 8-2 to further divide the signal. The buffer 8-3 outputs the "divided by 4" signal as $Out_1$. This buffer can be sized to drive a larger load.

FIG. 8b depicts the schematic diagram for the "divide by 3" 6-6 where the input $in_2$ is applied to clock the first FF (flip-flop) 8-4 and second FF 8-5 to further divide the signal. The output of the first FF is divided by 2 and applied to the AND gate 8-6. The buffer 8-7 outputs the "divided by 3" signal as $Out_2$. This buffer can be sized to drive a larger load. Also, although not illustrated, buffers can be inserted between the outputs of the VCO and the inputs $in_1$ and $in_2$ to provide gain if required.

A PLL (Phase Lock Loop) comprising: a differential VCO (Voltage Controlled Oscillator) with an output node and an inverse output node: the inverse output node coupled to an input of a first buffer; an output of the first buffer coupled to a input of a first function; an output of the first function coupled to a input of a divide by N; an output of the divide by N coupled to a first input of a PFD (Phase and Frequency Detect); a reference frequency coupled to a second input of the PFD; an output of the PFD coupled to an input of a charge pump; and output of the charge pump coupled to an input of the differential VCO; the output node coupled to an input of a second buffer; and an output of the second buffer coupled to a second function, further comprising: an output of the first function coupled to an input of a third buffer; an output of the second function coupled to an input of a fourth buffer, whereby an output of the third buffer is in a desired phase separation from an output of the fourth buffer, whereby the first function performs a first calculation, the second function performs a second calculation, and the first calculation is different from the second calculation, whereby the first calculation is a divide by X, the second calculation is a divide by Y, and the X is greater than the Y, further comprising: a source and a drain node of a first and a second MOS device connected to a first DC voltage; a gate of the first MOS device coupled to a second DC voltage by a first impedance; a gate of the second MOS device coupled to the second DC voltage by a second impedance; the gate of the first MOS device coupled by a first capacitor to the output node; and the gate of the second MOS device coupled by a second capacitor to the inverse output node, whereby the first DC voltage and the second DC voltage can be adjusted to adjust a capacitance of the first and the second MOS device, and whereby the capacitance of the first and the second MOS device is due to a state selected from the group consisting of inversion, depletion and accumulation.

A method of coupling a first function with a VCO's (Voltage Controlled Oscillator) output signal and independently coupling a second function with the VCO's inverse output signal comprising the steps of: buffering the VCO's output signal with a first buffer to generate a buffered clock; buffering the VCO's inverse output signal with a second buffer to generate a buffered inverse clock; coupling the buffered clock to the first function; coupling the buffered inverse clock to the second function; thereby coupling the first function with the VCO's output signal and independently coupling the second function with the VCO's inverse output signal, wherein the first buffer is substantially equal to the second buffer, wherein the VCO's output signal is substantially 180° out of phase with the VCO's inverse output signal, wherein the first function performs a first calculation, the second function performs a second calculation, and the first calculation is different from the second calculation, wherein the first calculation is a divide by X, the second calculation is a divide by Y, and the X is greater than the Y, further comprising the steps of: applying an output of the second function to a feedback path of a PLL (Phase Lock Loop), and wherein the PLL compares a reference frequency with the feedback path of the PLL.

A differential VCO (Voltage Controlled Oscillator) comprising: an output node and an inverse output node of the differential VCO; a first interconnect coupling the output node to a first function; a second interconnect coupling the inverse output node to a second function; a first interconnect capacitance of the first interconnect; a second interconnect capacitance of the second interconnect; a first function capacitance of an input of the first function; a second function capacitance of an input of the second function, whereby the first interconnect capacitance or the second interconnect capacitance is adjusted such that a first summation of the first interconnect capacitance and the first, function capacitance substantially equals a second summation of the second interconnect capacitance and the second function capacitance, whereby the first function performs a first calculation, the second function performs a second calculation, and the first calculation is different from the second calculation, further comprising: a source and a drain node of a first and a second MOS device connected to a first DC voltage; a gate of the first MOS device coupled to a second DC voltage by a first impedance; a gate of the second MOS device coupled to the second DC voltage by a second impedance; the gate of the first MOS device coupled by a first capacitor to the output node; and the gate of the second MOS device coupled by a second capacitor to the inverse output node, whereby the adjustment of the first interconnect capacitance and second interconnect capacitance is due to a change in a geometric structure of patterned metal layers in a die, further comprising: an inductor connected between the output node and the inverse output node, further comprising: and at least one regenerative circuit coupled to the output node and the inverse output node.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. Although the circuits were described using CMOS, the same circuit techniques can be applied to depletion mode devices and BJT or biploar circuits, since this technology allows the formation of current sources and source followers. When a device is specified, the device can be a transistor such as an N-MOS or P-MOS. The CMOS or SOI (Silicon on Insulator) technology provides two enhancement mode channel types: N-MOS (n-channel) and P-MOS (p-channel) devices or transistors.

What is claimed is:

1. A PLL (Phase Lock Loop) comprising:
a differential VCO (Voltage Controlled Oscillator) with an output node and an inverse output node;
said inverse output node coupled to an input of a first buffer;

an output of said first buffer coupled to an input of a first function;
an output of said first function coupled to an input of a divide by N;
an output of said divide by N coupled to a first input of a PFD (Phase and Frequency Detect);
a reference frequency coupled to a second input of said PFD;
an output of said PFD coupled to an input of a charge pump;
an output of said charge pump coupled to an input of said differential VCO;
said output node coupled to an input of a second buffer;
an output of said second buffer coupled to a second function;
an output of said first function coupled to an input of a third buffer; and
an output of said second function coupled to an input of a fourth buffer, wherein
an output of said third buffer is in a desired phase separation from an output of said fourth buffer.

2. The PLL, of claim 1, wherein
said first function performs a first calculation,
said second function performs a second calculation, and
said first calculation is different from said second calculation.

3. The PLL of claim 2, wherein
said first calculation is a divide by X,
said second calculation is a divide by Y, and
said X is greater than said Y.

4. The PLL of claim 2, further comprising:
a source and a drain node of a first and a second MOS device connected to a first DC voltage;
a gate of said first MOS device coupled to a second DC voltage by a first impedance;
a gate of said second MOS device coupled to said second DC voltage by a second impedance;
said gate of said first MOS device coupled by a first capacitor to said output node; and
said gate of said second MOS device coupled by a second capacitor to said inverse output node.

5. The PLL of claim 4, wherein
said first DC voltage and said second DC voltage can be adjusted to adjust a capacitance of said first and said second MOS device.

6. The PLL of claim 5, wherein
said capacitance of said first and said second MOS device is due to a state selected from the group consisting of inversion, depletion and accumulation.

7. A differential VCO (Voltage Controlled Oscillator) comprising:
an output node and an inverse output node of said differential VCO;
a first interconnect coupling said output node to a first function;
a second interconnect coupling said inverse output node to a second function;
a first interconnect capacitance of said first interconnect;
a second interconnect capacitance of said second interconnect;
a first function capacitance of an input of said first function;
a second function capacitance of an input of said second function, wherein
said first interconnect capacitance or said second interconnect capacitance is adjusted such that a first summation of said first interconnect capacitance and said first function capacitance substantially equals a second summation of said second interconnect capacitance and said second function capacitance; and
an inductor connected between said output node and said inverse output node.

8. The VCO of claim 7, wherein
said first function performs a first calculation,
said second function performs a second calculation, and
said first calculation is different from said second calculation.

9. The VCO of claim 8, further comprising:
a source and a drain node of a first and a second MOS device connected to a first DC voltage;
a gate of said first MOS device coupled to a second DC voltage by a first impedance;
a gate of said second MOS device coupled to said second DC voltage by a second impedance;
said gate of said first MOS device coupled by a first capacitor to said output node; and
said gate of said second MOS device coupled by a second capacitor to said inverse output node.

10. The VCO of claim 7, further comprising:
at least one regenerative circuit coupled to said output node and said inverse output node.

11. A differential VCO (Voltage Controlled Oscillator) comprising:
an output node and an inverse output node of said differential VCO;
a first interconnect coupling said output node to a first function;
a second interconnect coupling said inverse output node to a second function;
a first interconnect capacitance of said first interconnect;
a second interconnect capacitance of said second interconnect;
a first function capacitance of an input of said first function;
a second function capacitance of an input of said second function, wherein
said first interconnect capacitance or said second interconnect capacitance is adjusted such that a first summation of said first interconnect capacitance and said first function capacitance substantially equals a second summation of said second interconnect capacitance and said second function capacitance; and
an adjustment of said first interconnect capacitance and second interconnect capacitance is due to a change in a geometric structure of patterned metal layers in a die.

* * * * *